(12) United States Patent
Tang et al.

(10) Patent No.: US 8,658,480 B2
(45) Date of Patent: Feb. 25, 2014

(54) METHOD FOR MANUFACTURING ACTIVE ARRAY SUBSTRATE

(75) Inventors: Wen-Chung Tang, Hsinchu (TW); Fang-An Shu, Hsinchu (TW); Yao-Chou Tsai, Hsinchu (TW); Ted-Hong Shinn, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 0 days.

(21) Appl. No.: 13/615,626

(22) Filed: Sep. 14, 2012

(65) Prior Publication Data

US 2013/0210201 A1 Aug. 15, 2013

(30) Foreign Application Priority Data

Feb. 10, 2012 (TW) .............................. 101104428 A (51) Int. Cl.
*H01L 21/00* (2006.01)
(52) U.S. Cl.
USPC .......................................... 438/149; 438/151

(58) Field of Classification Search
CPC .................. H01L 29/786; H01L 2924/13069; H01L 27/1214; H01L 27/1251; H01L 27/1288
USPC ......... 438/149, 151, 695, 698, 725, 758, 761, 438/781, 958; 257/E21.026, E21.258, 257/E21.259, E21.492
See application file for complete search history.

(56) References Cited

U.S. PATENT DOCUMENTS

2009/0108260 A1* 4/2009 Lin et al. ......................... 257/59

* cited by examiner

*Primary Examiner* — Khiem D Nguyen
(74) *Attorney, Agent, or Firm* — CKC & Partners Co., Ltd.

(57) ABSTRACT

A method for manufacturing an active array substrate is provided herein. The active array substrate can be manufactured by using only two photolithography process steps. The photolithography process step using a first photomask may be provided for forming a drain electrode, a source electrode, a data line and/or a data line connecting pad and a patterned transparent conductive layer, etc. The photolithography process step using a second photomask may be utilized for forming a gate electrode, a gate line, a gate insulating layer, a channel layer and/or a gate line connecting pad, and so forth.

12 Claims, 7 Drawing Sheets

METHOD FOR MANUFACTURING ACTIVE ARRAY SUBSTRATE

RELATED APPLICATIONS

This application claims priority to Taiwan Application Serial Number 10104428 filed Feb. 10, 2012, which is herein incorporated by reference.

BACKGROUND

1. Technical Field

The present disclosure relates to a method for manufacturing an active array substrate.

2. Description of Related Art

A flat panel display device such as a liquid crystal display device has been widely applied in a variety of electronic products. The flat panel display device typically includes an active array substrate for driving pixels in the flat panel display device. Generally, a method for manufacturing the active array substrate needs to conduct five photolithography process steps each of which consumes production cost. In recent years, in order to economically produce the active array substrate, a manufacturing method using four photolithography process steps has been developed in this industry so as to efficiently produce the active array substrate. However, there is still a need to develop a more competitive and economic manufacturing method to further improve product efficiency and to reduce manufacturing cost.

SUMMARY

A purpose of the disclosure is to provide a method for manufacturing an active array substrate by using only two photolithography process steps, and the active array substrate made thereby has good reliability. Therefore, the embodiments in the disclosure may provide economic benefits and enhance product performance.

According to one embodiment of the disclosure the method includes sequentially forming a transparent conductive layer and a first metal layer to cover a substrate. A first patterned photoresist layer having a halftone portion is formed on the first metal layer, in which a portion of the first metal layer is exposed. The exposed portion of the first metal layer and a portion of the transparent conductive layer therebeneath are removed to form a first patterned metal layer and a patterned transparent conductive layer, respectively, and the halftone portion of the first patterned photoresist layer is removed to expose a portion of the first patterned metal layer. The exposed portion of the first patterned metal layer is removed, and a remaining portion of the first patterned photoresist layer is also removed to form an intermediate structure. A semiconductor layer, an insulating layer and a second metal layer are sequentially formed to cover the intermediate structure. A second patterned photoresist layer is formed on the second metal layer, in which a portion of the second metal layer is exposed. The exposed portion of the second metal layer, and a portion of the insulating layer and a portion of the semiconductor layer underlying the exposed portion of the second metal layer are removed to form a stacked structure composed of a second patterned metal layer, a patterned insulating layer and a patterned semiconductor layer. The second patterned photoresist layer is heated to become flowable, thereby forming a passivation layer covering the stacked structure.

According to another embodiment of the disclosure, the method for manufacturing the active array substrate includes sequentially blanket forming a transparent conductive layer and a first metal layer covering a substrate. A first patterned photoresist layer is then formed on the first metal layer, in which the first patterned photoresist layer includes a first portion and a second portion, the second portion having a thick part and a thin part, and a thickness of the thick part is greater than a thickness of the thin part. The first metal layer and the transparent conductive layer therebeneath are patterned to form a first patterned metal layer and a patterned transparent conductive layer and to form a data line connecting pad under the first portion, and the thin part of the second portion is removed to expose a portion of the first patterned metal layer. Next, the exposed portion of the first patterned metal layer is removed to expose a portion of the patterned transparent conductive layer, and the first patterned metal layer under the thick part acts as a source electrode and a drain electrode. The first portion and the thick part of the second portion of the first patterned photoresist layer are then removed. Afterwards, a semiconductor layer, an insulating layer and a second metal layer are sequentially formed to cover the drain electrode the source electrode the data line connecting pad and the exposed portion of the patterned transparent conductive layer. A second patterned photoresist layer is then formed on the second metal layer. The second patterned photoresist layer includes a third portion, a fourth portion and a fifth portion. The third portion has an opening exposing a portion of the second metal layer and a surrounding part surrounding the opening. The fourth portion has a medial part and a peripheral part surrounding the medial part, and a thickness of the medial part is smaller than a thickness of the peripheral part. Next, the second metal layer, and the insulating layer and the semiconductor layer beneath the second metal layer are patterned to form a surrounding wall which is under the third portion and surrounds the data line connecting pad, a gate line connecting pad under the fourth portion, and a gate electrode, a gate insulating layer and a channel layer connecting to the drain electrode and the source electrode under the fifth portion, and the medial part of the fourth portion is removed to expose a portion of the gate line connecting pad. Finally, a remaining portion of the second patterned photoresist layer is heated to become flowable, thereby forming a passivation layer covering the gate electrode, the gate insulating layer, the channel layer, the drain electrode, the source electrode, the surrounding wall and an outer edge of the gate line connecting pad.

BRIEF DESCRIPTION OF THE DRAWINGS

The disclosure may be more fully understood by reading the following detailed description of the embodiment, with reference made to the accompanying drawings as follows.

DETAILED DESCRIPTION

The disclosure is described by the following specific embodiments. Those with ordinary skill in the arts can readily understand the other advantages and functions of the present invention after reading the disclosure of this specification.

The disclosure can also be implemented with different embodiments. Various details described in this specification can be modified based on different viewpoints and applications without departing from the scope of the disclosure.

Reference will now be made in detail to the present embodiments of the disclosure, examples of which are illustrated in the accompanying drawings. Wherever possible, the same reference numbers are used in the drawings and the description to refer to the same or like parts.

Figure 1:
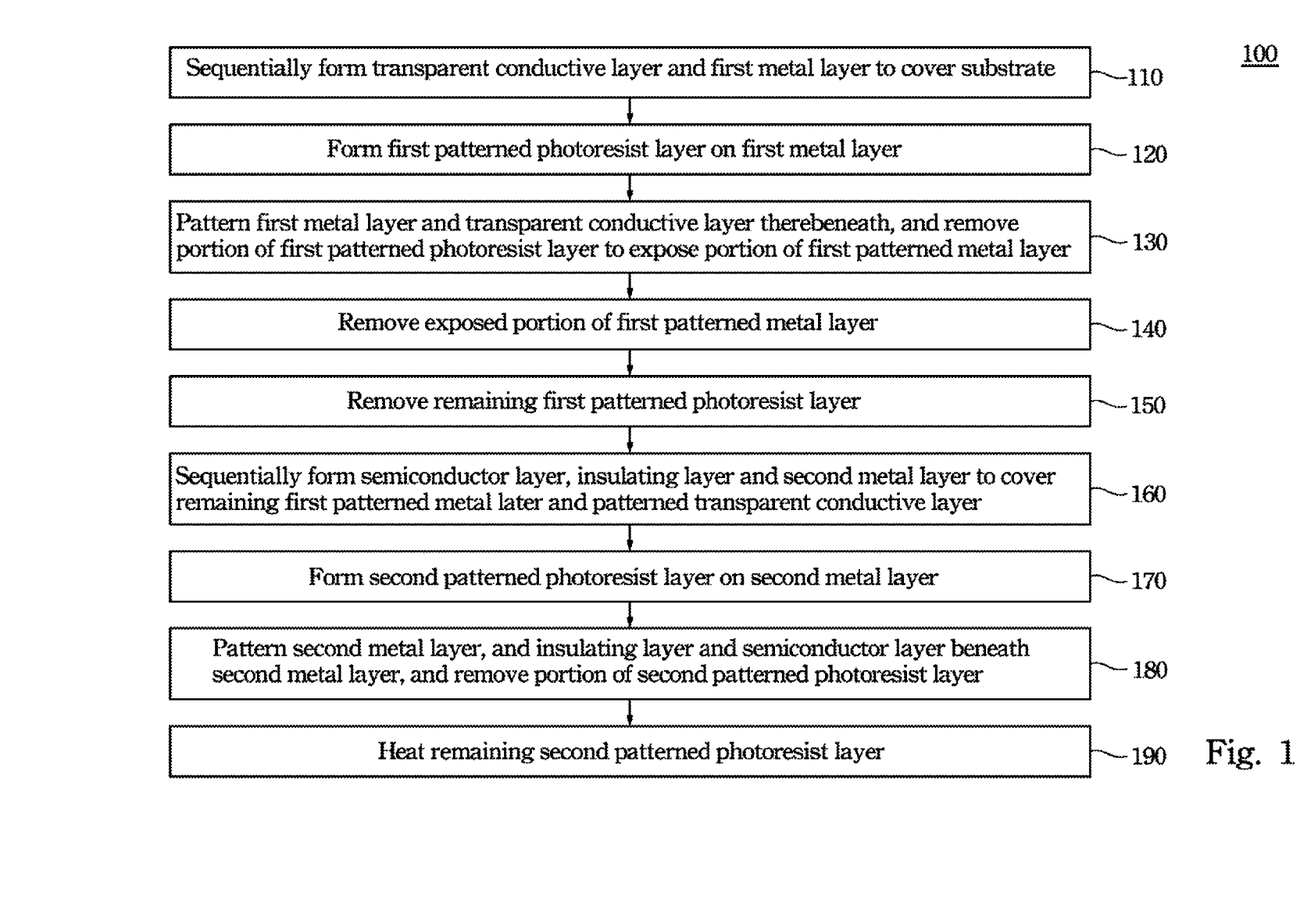
FIG. 1 is a flow chart schematically illustrating a method for manufacturing an active array substrate according to one embodiment of the disclosure.

FIG. 1 is a flow chart schematically illustrating a method 100 for manufacturing an active array substrate according to one embodiment of the disclosure. FIGS. 2, 3, 4, 5, 6A and 7 are cross-sectional views schematically illustrating process steps of the method 100 in sequence. The active array substrate manufactured by the methods disclosed herein may be applied in a variety of display devices, such as a thin film transistor liquid crystal display device, an electronic paper display device or an organic light emitting diode display device, etc.

Figure 2:
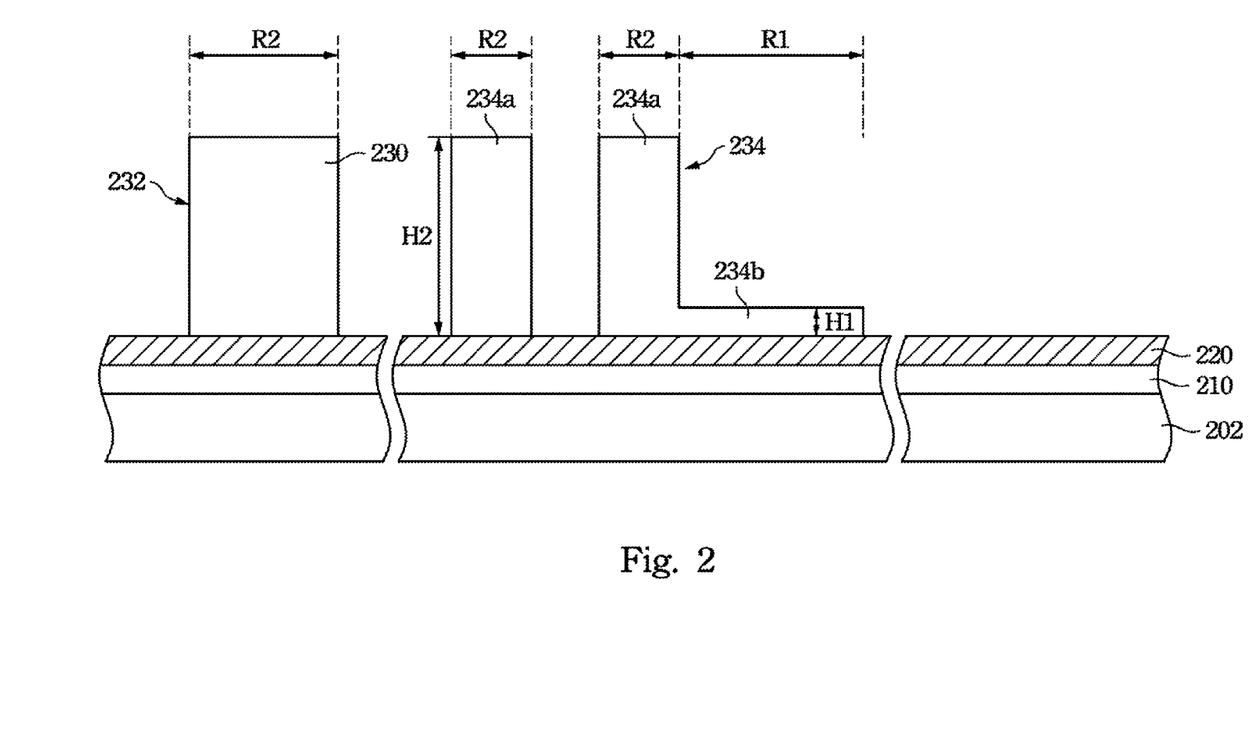
FIGS. 2, 3, 4, 5, 6A and 7 are cross-sectional views schematically illustrating process steps for manufacturing an active array substrate according to one embodiment of the disclosure.

In step 110, a transparent conductive layer 210 and a first metal layer 220 are sequentially blanket formed for covering a substrate 202, as shown in FIG. 2. Any material or process in the art may be applied in step 110. For instance, the transparent conductive layer 210 may be made of a transparent conductive material such as indium tin oxide (ITO), and so forth, or a material having high reflectivity such as aluminum or silver, etc. The first metal layer 220 may be made of molybdenum (Mo), chromium (Cr), aluminum (Al), neodymium (Nd), titanium (Ti) or combinations thereof or alloys thereof. The substrate 202 may be formed of glass or polymer materials.

In step 120, a first patterned photoresist layer 230 is formed on the first metal layer 220, as shown in FIG. 2. The first patterned photoresist layer 230 is divided into a first region R1 and a second region R2. The first patterned photoresist layer 230 in the first region R1 (i.e., that is a first region photoresist) has a thickness H1 smaller than a thickness H2 of the first patterned photoresist layer 230 in the second region R2 (i.e., that is a second region photoresist). In an embodiment, the first patterned photoresist layer 230 in both the first region R1 and the second region R2 is formed by employing an exposure process with a halftone mask. Specifically, the first region photoresist is a halftone portion.

In one embodiment, the first patterned photoresist layer 230 includes a first portion 232 and a second portion 234 having a thick part 234a and a thin part 234b. The thick part 234a has a thickness H2 greater than a thickness H1 of thin part 234b. The first portion 232 is used to form a data line connecting pad in the follow-up processes (that will be described in more detail later in step 130). The second portion 234 is provided for forming a source electrode, a drain electrode and a pixel electrode (that will be described in further detail in steps 130 and 140).

The first portion 232 and the thick part 234a of the second portion 234 are located in the second region R2; namely, the first portion 232 and the thick part 234a have substantially the same thickness H2. The thin part 234b of the second portion 234 is situated in the first region R1; in other words, the thin part 234b has the thickness H1

In an embodiment, the first patterned photoresist layer 230 is formed by the processes of coating, drying, halftone exposure, development and post-bake. The post-bake process is employed in an environment of about 100° C. to about 150° C. to dry and/or cure the photoresist pattern formed after the development process, thereby forming the first patterned photoresist layer 230.

Figure 3:
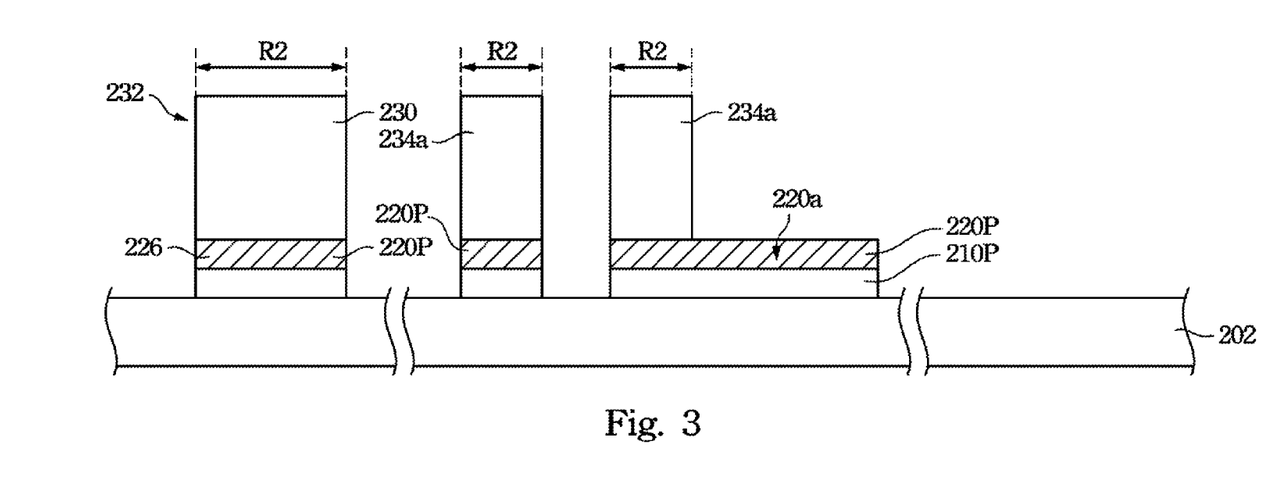

In step 130, the exposed portion of the first metal layer 220 and a portion of the transparent conductive layer 210 therebeneath are removed to form a first patterned metal layer 220P and a patterned transparent conductive layer 210P, as shown in FIG. 3.

In one embodiment, the first patterned photoresist layer 230 is utilized as a mask for removing the exposed portion of the first metal layer 220 and the portion of the transparent conductive layer 210 therebeneath and removing the first patterned photoresist layer 230 in the first region R1 in the same etching process. For instance, a dry etching process, a wet etching process or a combination of a dry and a wet etching processes may be employed to remove the exposed portion of the first metal layer 220 and the portion of the transparent conductive layer 210 therebeneath. During the etching process, an etchant corrodes or dissolves a portion of the first patterned photoresist layer 230 and reduces the thickness thereof. Therefore, the first patterned photoresist layer 230 in the first region R1 (i.e., a thinner portion of the first patterned photoresist layer 230) is removed so as to expose a portion 220a of the first patterned metal layer 220P.

In one embodiment, as represented in FIG. 3, a data line connecting pad 226 is formed under the first portion 232 while the patterning step 130 is performed. Moreover, the thin part 234b of the second portion 234 is also removed in the same step to expose the portion 220a of the first patterned metal layer 220P.

Figure 4:
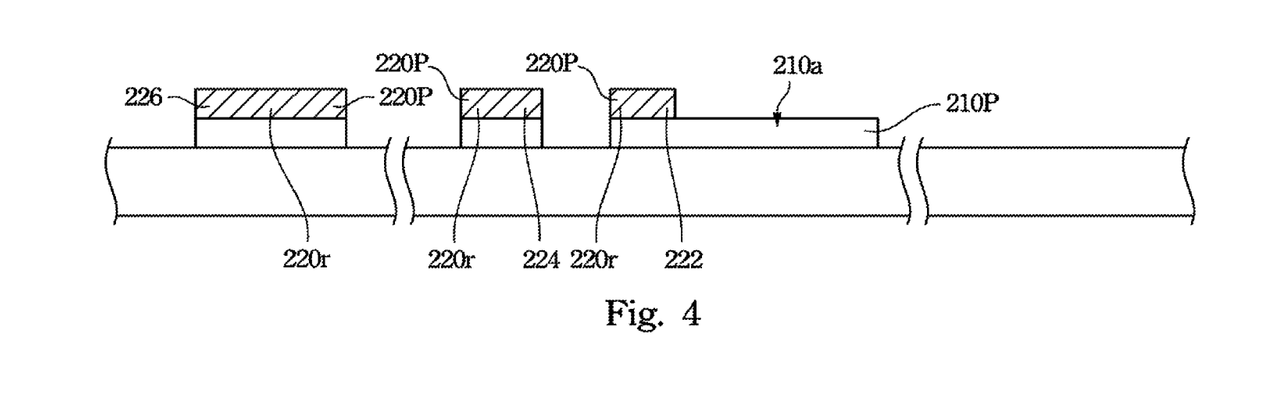

In step 140, the exposed portion 220a of the first patterned metal layer 220P is removed to expose a portion 210a of the patterned transparent conductive layer 210P, as shown in FIG. 4. In an embodiment, a wet etching process is applied to remove the exposed portion 220a of the first patterned metal layer 220P. The portion 210a of the patterned transparent conductive layer 210P acts as a pixel electrode. Also, a remaining portion 220r of the first patterned metal layer 220P is formed in the same step. In one embodiment, the remaining portion 220r of the first patterned metal layer 220P includes a drain electrode 222, a source electrode 224 and the data line connecting pad 226.

In one embodiment, as illustrated in FIG. 4, the first patterned metal layer 220P under the thick part 234a is utilized as the source electrode 224 and the drain electrode 222 of an active component after the removing step 140 is carried out.

In step 150, a remaining portion of the first patterned photoresist layer 230 is removed. Specifically, the first patterned photoresist layer 230 in the second region R2 is removed, as shown in FIG. 4. For instance, a stripper solution may be applied to strip the remaining portion of the first patterned photoresist layer 230.

In one embodiment, the first portion 232 and the thick part 234a of the second portion 234 are removed to expose the source electrode 224 and the drain electrode 222 in step 150, thereby forming an intermediate structure shown in FIG. 4.

Figure 5:
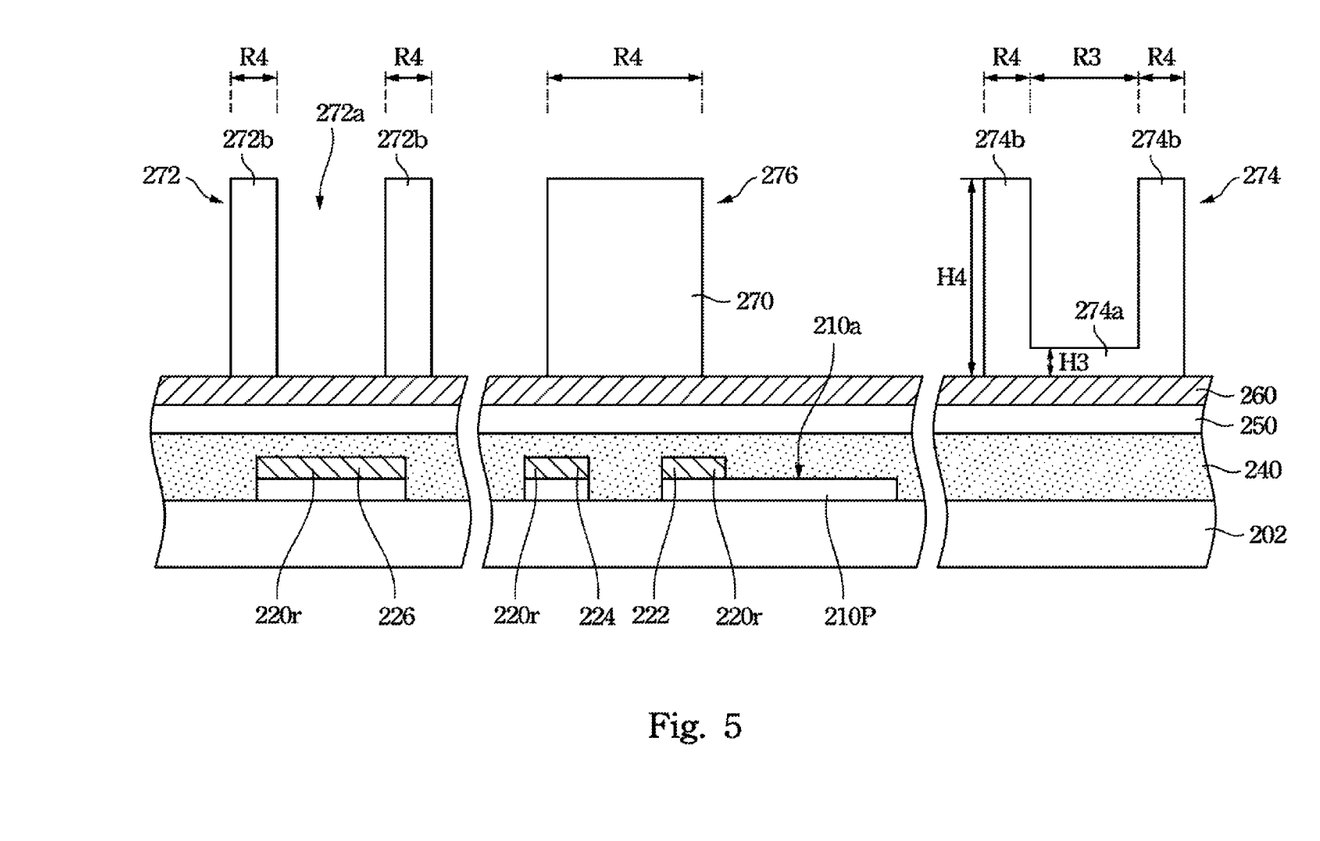

In step 160, as represented in FIG. 5, a semiconductor layer 240, an insulating layer 250 and a second metal layer 260 are sequentially blanket formed for covering the remaining portion 220r of the first patterned metal layer 220P and the portion 210a of the patterned transparent conductive layer 210P. That is, the semiconductor layer 240, the insulating layer 250 and the second metal layer 260 are formed in sequence so as to cover the intermediate structure shown in FIG. 4. In one embodiment, at first, the semiconductor layer 240 may be deposited. Subsequently, the insulating layer 250 is deposited on the semiconductor layer 240, and the second metal layer 260 is then deposited on the insulating layer 250. As a result, the semiconductor layer 240 covers the drain electrode 222, the source electrode 224, the data line connecting pad 226 and the portion 210a of the patterned transparent conductive layer 210P.

Any material or process in the art can be applied in step 160. For example, the semiconductor layer 240 may be formed from amorphous silicon (a-Si), polysilicon (poly-Si), organic semiconductors or metal oxide semiconductor materials such as amorphous-indium gallium zinc oxide (a-IGZO) indium zinc oxide (IZO) or amorphous-indium zinc tin oxide (a-IZTO), etc. The insulating layer 250 may be formed from silicon oxide, silicon nitride or organic insulating materials. The material of the second metal layer 260 may be the same as or different from that of the first metal layer 220. For instance, the second metal layer 260 may include molybdenum (Mo), chromium (Cr) aluminum (Al), neodymium (Nd), titanium (Ti) or a combination thereof. Any suitable process for forming the semiconductor layer 240, the insulating layer 250 and the second metal layer 260 may be determined in accordance with materials of those layers.

In step 170, a second patterned photoresist layer 270 is formed on the second metal layer 260, as depicted in FIG. 5. The second patterned photoresist layer 270 is divided into a third region R3 and a fourth region R4. The second patterned photoresist layer 270 in the third region R3 (i.e., a third region photoresist) has a thickness H3 smaller than a thickness H4 of the second patterned photoresist layer 270 in the fourth region R4 (i.e., a fourth region photoresist). The material of the second patterned photoresist layer 270 may be the same as or different from that of the first patterned photoresist layer 230.

In one embodiment, the second patterned photoresist layer 270 includes a third portion 272, a fourth portion 274 and a fifth portion 276. The third portion 272 is disposed over the data line connecting pad 226 and has an opening 272a and a surrounding part 272b. The opening 272a exposes a portion of the second metal layer 260. The surrounding part 272b surrounds the opening 272a. The fourth portion 274 has a medial part 274a and a peripheral part 274b surrounding the medial part 274a. The medial part 274a has a thickness H3 smaller than a thickness H4 of the peripheral part 274b. In the embodiment, the second patterned photoresist layer 270 further includes the fifth portion 276 disposed substantially over the drain electrode 222 and the source electrode 224. The fifth portion 276 is utilized to form a gate electrode, a gate insulating layer and a channel layer of the active component in the subsequent steps (that will be described in more detail in step 180).

The surrounding part 272b of the third portion 272, the peripheral part 274b of the fourth portion 274 and the fifth portion 276 are located in the fourth region R4; namely, the surrounding part 272b, the peripheral part 274b and the fifth portion 276 have substantially the same thickness H4. The medial part 274a of the fourth portion 274 is situated in the third region R3; in other words, the medial part 274a has the thickness H3.

In one embodiment, the second patterned photoresist layer 270 may be made of a photoresist material (e.g., AZ®-501 available from Clariant Corporation, Japan), which includes an acrylic resin, an epoxy resin or a phenol resin.

Figure 6A:
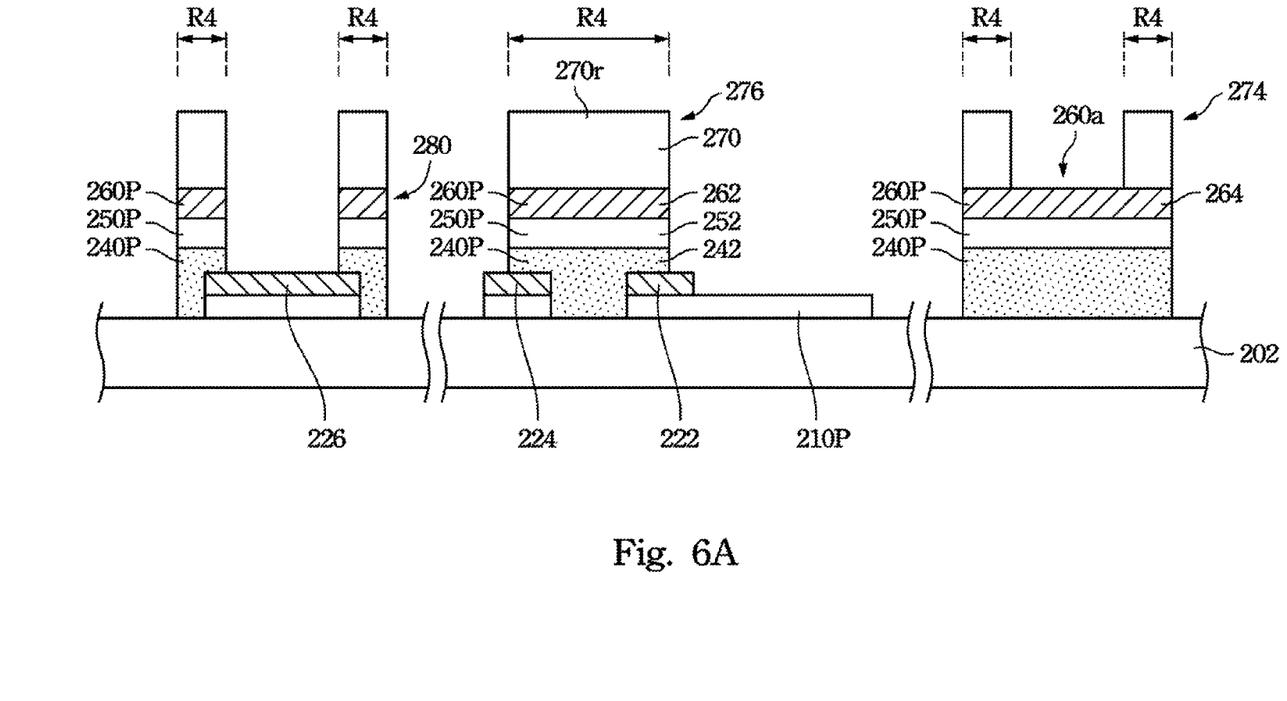

In step 180, as depicted in FIG. 6A, the exposed portion of the second metal layer 260, and a portion of the insulating layer 250 and a portion of the semiconductor layer 240 under the exposed portion of the second metal layer 260 are removed, thereby forming a second patterned metal layer 260P, a patterned insulating layer 250P and a patterned semiconductor layer 240P.

In one embodiment, the second patterned photoresist layer 270 may be utilized as a mask for removing the exposed portion of the second metal layer 260, and the portion of the insulating layer 250 and the portion of semiconductor layer 240 under the exposed portion of the second metal layer 260; and removing the second patterned photoresist layer 270 in the third region R3 in the same etching process. A dry etching process, a wet etching process or a combination of a dry and a wet etching processes may be employed for removing those layers described above. In one example, the exposed portion of the second metal layer 260 is removed by a wet etching process so as to expose a portion of the insulating layer 250 therebeneath. Subsequently, a dry etching process is utilized to remove the exposed portion of the insulating layer 250 and the semiconductor layer 240 therebeneath. Accordingly, the second patterned metal layer 260P, the patterned insulating layer 250P, and the patterned semiconductor layer 240P have substantially the same pattern, thereby forming a stacked structure. Moreover, an etchant corrodes and dissolves a portion of the second patterned photoresist layer 270, thereby reducing the thickness thereof during the process of etching the second metal layer 260, the insulating layer 250 and the semiconductor layer 240. Therefore, the second patterned photoresist layer 270 in the third region R3 will be removed during the etching process. In other words, when reaching an etch endpoint of the semiconductor layer 240, an etched thickness of the second patterned photoresist layer 270 by the etchant is about H3. As a result, the photoresist layer 270 in the third region R3 is removed to expose a portion 260a of the second metal layer 260.

In one embodiment, in step 180 shown in FIG. 6A, a surrounding wall 280, a gate line connecting pad 264, and the stacked structure composed of a gate electrode 262, a gate insulating layer 252 and a channel layer 242 are formed. The surrounding wall 280 is formed under the third portion 272 of the photoresist layer 270. The surrounding wall 280 surrounds the data line connecting pad 226 in which a portion of the connecting pad 226 is exposed. The gate line connecting pad 264 is formed under the fourth portion 274 of the photoresist layer 270. The stacked structure composed of the gate electrode 262, the gate insulating layer 252 and the channel layer 242 is formed under the fifth portion 276 of the photoresist layer 270. During the patterning step mentioned above, the medial part 274a of the fourth portion 274 is also removed to expose the portion 260a of the gate line connecting pad 264.

Figure 6B:
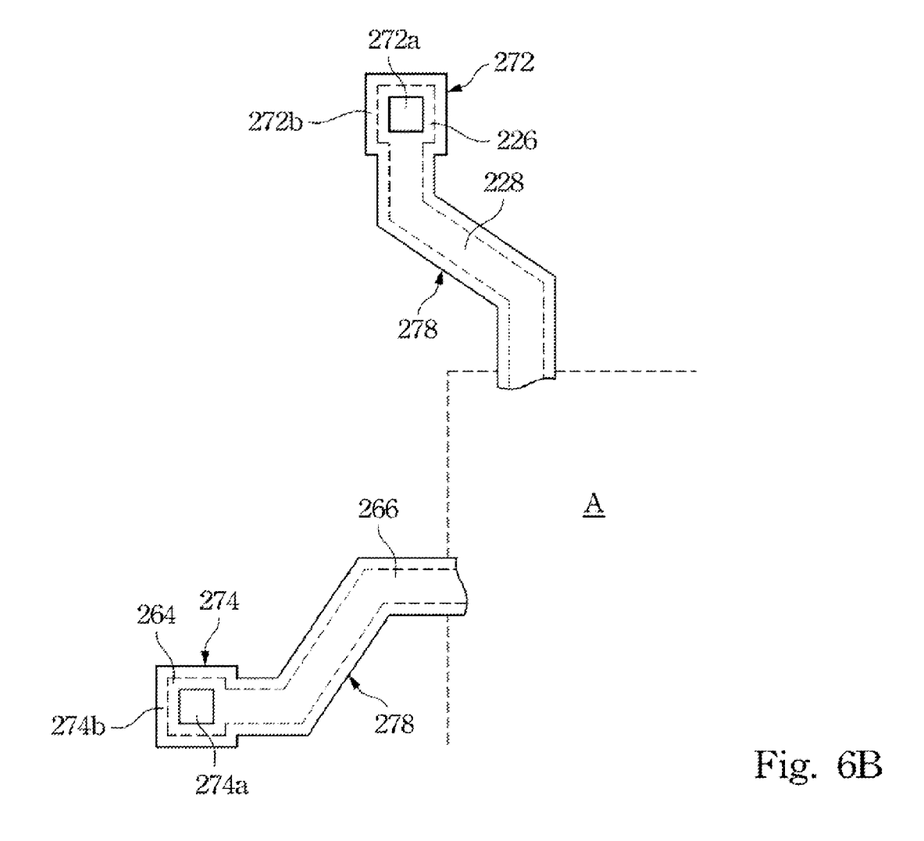
FIG. 6B is a top view schematically illustrating a process step for manufacturing an active array substrate according to one embodiment of the disclosure.

FIG. 6B is a top view after step 180 is performed according to one embodiment of the disclosure. The active array substrate has an active area A, and active components such as thin film transistors and so forth are disposed in the active area A. The gate line connecting pad 264 and the data line connecting pad 226 are located at a periphery of the active area A of the active array substrate and are respectively used to connect a gate integrated circuit (not shown) and a data integrated circuit (not shown). In the embodiment, a gate line 266 can be simultaneously formed while step 180 is performed; that is, the gate line 266, the gate electrode 262 and the gate line connecting pad 264 are formed in the same photolithography process step. In the embodiment, the second patterned photoresist layer 270 further includes a sixth portion 278 disposed over the data line 288 and the gate line 266. Therefore, a portion of the patterned semiconductor layer 240P, a portion of the patterned insulating layer 250P and a portion of the second patterned metal layer 260P cover the data line 228. Another portion of the patterned insulating layer 250P and another portion of the patterned semiconductor layer 240P are located under the gate line 266.

Figure 7:
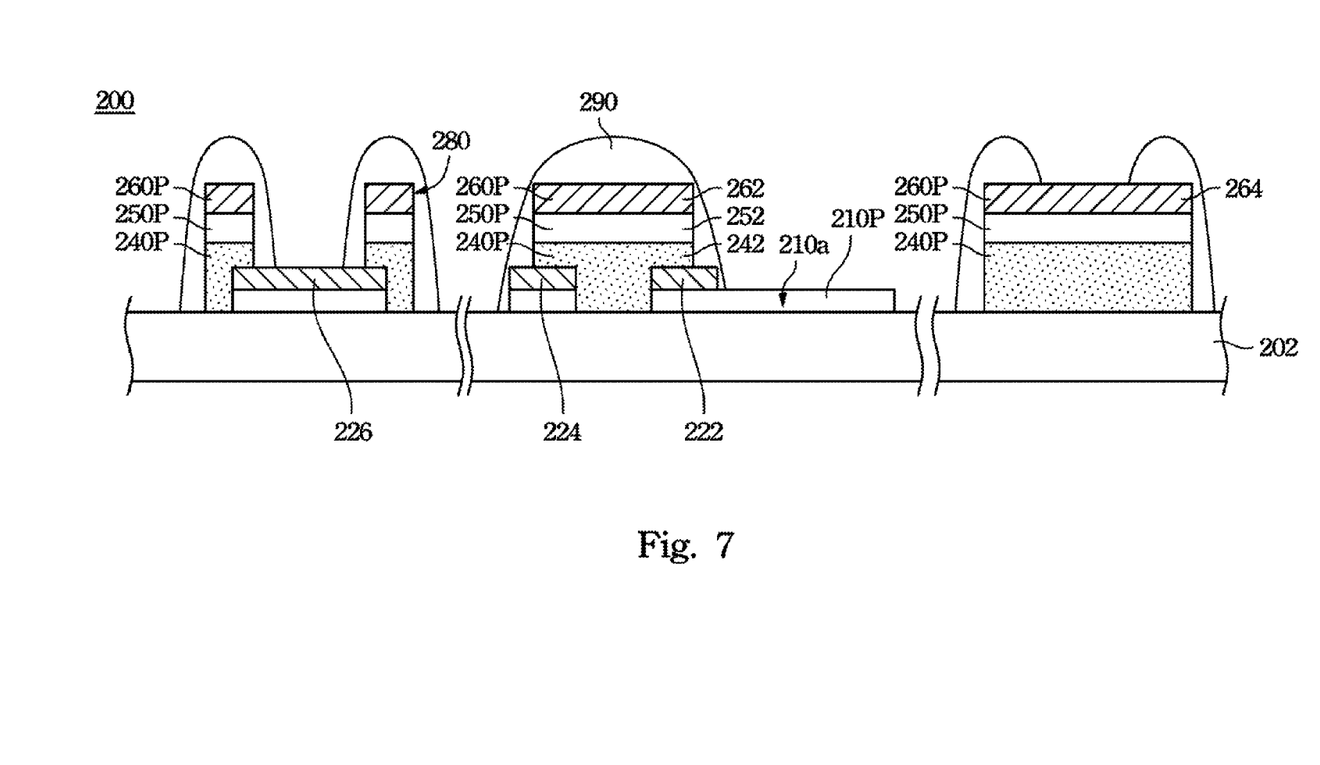

In step 190, as shown in FIG. 7, the second patterned photoresist layer 270 in the fourth region R4 is heated to become flowable, thereby forming a passivation layer 290. The passivation layer 290 covers sidewalls of the second patterned metal layer 260P, side ails of the patterned insulating layer 250P and sidewalls of the patterned semiconductor layer 240P.

In one embodiment, a remaining portion of the second patterned photoresist layer 270r is heated to become flowable, thereby covering the gate electrode 262, the gate insulating layer 252, the channel layer 242, the drain electrode 222, the source electrode 224, the surrounding wall 280 and an outer edge of the gate line connecting pad 264; namely, the passivation layer 290 is formed for covering those elements mentioned above. Nonetheless, a portion of the data line connecting pad 226, a portion of the gate line connecting pad 264 and a portion of the patterned transparent conductive layer 210P are not covered by the passivation layer 290. In one example, the remaining portion of the second patterned photoresist layer 270r is heated to be melted and flowable in an environment of about 200° C. to about 400° C.

As mentioned above, only two photolithography process steps are needed for manufacturing the active array substrate 200 according to the embodiments of the disclosure. The photolithography process step using a first photomask may be utilized for forming the drain electrode 222, the source electrode 224, the data line 228 and/or the data line connecting pad 226 and the patterned transparent conductive layer 210P, etc. The portion 210a of the patterned transparent conductive layer 210P acts as the pixel electrode. The photolithography process step using a second photomask may be employed for forming the patterned semiconductor layer 240P, the patterned insulating layer 250P, and the second patterned metal layer 260P. Specifically, the photolithography process step using the second photomask may be used to form the components such as the gate electrode 262, the gate line 266, the gate insulating layer 252, the channel layer 242 and/or the gate line connecting pad 264, etc. Therefore, the embodiments disclosed in the disclosure can provide extremely great economic benefits and greatly reduce manufacturing cost.

In addition, surrounding portions of both the gate line connecting pad 264 and the data line connecting pad 226 are covered by the passivation layer 290, such that reliability of those connecting pads can be ensured. Moreover, the gate electrode 262, the gate line 266, the gate insulating layer 252 and the channel layer 242 are also covered by the passivation layer 290, so that the active component also has excellent reliability.

Although the disclosure has been described in considerable detail with reference to certain embodiments thereof, other embodiments are possible. Therefore, the spirit and scope of the appended claims should not be limited to the description of the embodiments contained herein.

It will be apparent to those ordinarily skilled in the art that various modifications and variations may be made to the structure of the disclosure without departing from the scope or spirit of the disclosure. In view of the foregoing, it is intended that the disclosure cover modifications and variations of this disclosure provided they fall within the scope of the following claims.

What is claimed is:

1. A method for manufacturing an active array substrate, the method comprising:
    sequentially forming a transparent conductive layer and a first metal layer to cover a substrate;
    forming a first patterned photoresist layer having a halftone portion on the first metal layer and exposing an exposed portion of the first metal layer;
    removing the exposed portion of the first metal layer and a portion of the transparent conductive layer therebeneath to form a first patterned metal layer and a patterned transparent conductive layer, respectively, and removing the halftone portion of the first patterned photoresist layer to expose an exposed portion of the first patterned metal layer;
    removing the exposed portion of the first patterned metal layer, and removing a remaining portion of the first patterned photoresist layer to form an intermediate structure;
    sequentially forming a semiconductor layer, an insulating layer and a second metal layer to cover the intermediate structure;
    forming a second patterned photoresist layer on the second metal layer, wherein an exposed portion of the second metal layer is exposed;
    removing the exposed portion of the second metal layer, and a portion of the insulating layer and a portion of the semiconductor layer underlying the exposed portion of the second metal layer to form a stacked structure composed of a second patterned metal layer, a patterned insulating layer and a patterned semiconductor layer; and
    heating the second patterned photoresist layer to become flowable, thereby forming a passivation layer covering the stacked structure.

2. The method of claim 1, wherein the step of forming the first patterned photoresist layer comprises forming a first region photoresist and a second region photoresist, wherein the halftone portion is the first region photoresist, and a thickness of the first region photoresist is smaller than a thickness of the second region photoresist.

3. The method of claim 1, wherein the step of forming the second patterned photoresist layer comprises forming a third region photoresist and a fourth region photoresist, wherein a thickness of the third region photoresist is smaller than a thickness of the fourth region photoresist.

4. The method of claim 3, further comprising removing the third region photoresist, wherein the step of removing third region photoresist is performed in the same step with the step of removing the exposed portion of the second metal layer and the portion of the insulating layer and the portion of the semiconductor layer beneath the exposed portion of the second metal layer.

5. The method of claim 1, wherein a portion of the patterned transparent conductive layer is not covered by the passivation layer.

6. The method of claim 1, wherein the second patterned metal layer, each of the patterned insulating layer and the patterned semiconductor layer has a substantially identical profile.

7. A method for manufacturing an active array substrate, the method comprising:
    sequentially forming a transparent conductive layer and a first metal layer to cover a substrate;
    forming a first patterned photoresist layer on the first metal layer, wherein the first patterned photoresist layer comprises a first portion and a second portion, the second portion having a thick part and a thin part, and a thickness of the thick part is greater than a thickness of the thin part;
    patterning the first metal layer and the transparent conductive layer therebeneath to form a first patterned metal layer and a patterned transparent conductive layer, respectively, and to form a data line connecting pad under the first portion; and removing the thin part of the second portion to expose an exposed portion of the first patterned metal layer;

removing the exposed portion of the first patterned metal layer to expose an exposed portion of the patterned transparent conductive layer, wherein the first patterned metal layer under the thick part acts as a source electrode and a drain electrode;

removing the first portion and the thick part of the second portion of the first patterned photoresist layer;

sequentially forming a semiconductor layer, an insulating layer and a second metal layer to cover the drain electrode, the source electrode, the data line connecting pad and the exposed portion of the patterned transparent conductive layer;

forming a second patterned photoresist layer on the second metal layer, wherein the second patterned photoresist layer comprises a third portion, a fourth portion and a fifth portion, the third portion having an opening exposing a portion of the second metal layer and a surrounding part surrounding the opening, the fourth portion having a medial part and a peripheral part surrounding the medial part, and a thickness of the medial part is smaller than a thickness of the peripheral part;

patterning the second metal layer, and the insulating layer and the semiconductor layer beneath the second metal layer to form a surrounding wall which is under the third portion and surrounds the data line connecting pad, a gate line connecting pad under the fourth portion and a gate electrode, a gate insulating layer and a channel layer connecting to the drain electrode and the source electrode under the fifth portion; and removing the medial part of the fourth portion to expose a portion of the gate line connecting pad; and heating a remaining portion of the second patterned photoresist layer to become flowable, thereby forming a passivation layer covering the gate electrode, the gate insulating layer, the channel layer, the drain electrode, the source electrode, the surrounding wall and an outer edge of the gate line connecting pad.

8. The method of claim 7, wherein the step of patterning the first metal layer comprises forming a data line, and the step of patterning the second metal layer comprises forming a gate line.

9. The method of claim 8, wherein the second patterned photoresist layer further comprises a sixth portion located over the data line and the gate line.

10. The method of claim 7, wherein the step of patterning the second metal layer, and the insulating layer and the semiconductor layer under the second metal layer comprises exposing a portion of the data line connecting pad.

11. The method of claim 7, wherein the step of patterning the second metal layer, and the insulating layer and the semiconductor layer beneath the second metal layer comprises the steps of:

performing a wet etching process to etch the second metal layer; and performing a dry etching process to etch the insulating layer and the semiconductor layer.

12. The method of claim 7, wherein the step of heating the remaining portion of the second patterned photoresist layer comprises placing the remaining portion of the second patterned photoresist layer in an environment substantially from 200° C. to 400° C.

* * * * *